(12) United States Patent
Sandoval

(10) Patent No.: US 12,327,845 B2
(45) Date of Patent: Jun. 10, 2025

(54) SYSTEM AND METHOD FOR IDENTIFYING DEFECTS IN AN ELECTRIC BATTERY SYSTEM

(71) Applicant: Allosense, Inc., Houston, TX (US)

(72) Inventor: Roman Sandoval, San Antonio, TX (US)

(73) Assignee: Allosense, Inc., San Antonio, TX (US)

( * ) Notice: Subject to any disclaimer, the term of this patent is extended or adjusted under 35 U.S.C. 154(b) by 178 days.

(21) Appl. No.: 17/897,189

(22) Filed: Aug. 28, 2022

(65) Prior Publication Data

US 2023/0216098 A1 Jul. 6, 2023

Related U.S. Application Data

(60) Provisional application No. 63/296,411, filed on Jan. 4, 2022.

(51) Int. Cl.
*H01M 10/42* (2006.01)
*G01R 31/367* (2019.01)
*G01R 31/54* (2020.01)
*H01M 10/48* (2006.01)

(52) U.S. Cl.
CPC ...... *H01M 10/4285* (2013.01); *G01R 31/367* (2019.01); *G01R 31/54* (2020.01); *H01M 10/482* (2013.01)

(58) Field of Classification Search
CPC ............ H01M 10/4285; H01M 10/482; G01R 31/367; G01R 31/54
USPC ...... 324/136, 500, 600, 76.11, 551, 425–434
See application file for complete search history.

(56) References Cited

U.S. PATENT DOCUMENTS

| | | | |
|---|---|---|---|
| 10,699,278 B2* | 6/2020 | Beaston | G06Q 10/06313 |
| 11,097,633 B1* | 8/2021 | Kohn | H02J 7/00 |
| 11,668,779 B2* | 6/2023 | Bertness | H02J 7/005 |
| | | | 324/426 |
| 2021/0242692 A1* | 8/2021 | Zhou | H01M 10/441 |
| 2023/0258736 A1* | 8/2023 | Pressgrove | G01R 35/005 |
| | | | 324/434 |

* cited by examiner

*Primary Examiner* — Raul J Rios Russo
*Assistant Examiner* — Trung Q Nguyen
(74) *Attorney, Agent, or Firm* — Outlier Patent Attorneys, PLLC

(57) ABSTRACT

An apparatus and method for testing a battery pack are provided. Measurement components are configured to measure parameters of battery components (e.g., batteries and battery connection components) within the battery pack. Trained models are applied to signals measured by the measurement components and provide an output indicative of a condition of the battery components.

19 Claims, 13 Drawing Sheets

SYSTEM AND METHOD FOR IDENTIFYING DEFECTS IN AN ELECTRIC BATTERY SYSTEM

CROSS-REFERENCE TO RELATED APPLICATIONS

The present application claims priority to U.S. provisional application No. 63/296,411, filed Jan. 4, 2022, and entitled "SYSTEM AND METHOD FOR IDENTIFYING DEFECTS IN AN ELECTRIC BATTERY SYSTEM", which is hereby incorporated herein in its entirety for all purposes.

BACKGROUND

Battery packs have many applications including their use in portable electronics, power storage for renewable energy distribution, backup power sources for cellular phone sites, power sub stations, electric vehicles, etc. Battery packs accept, store, and release electricity on demand and can consist of a plurality of battery modules. Battery modules may be formed by a number of individual battery cells or may themselves be individual battery cells depending on the configuration of the battery. Battery packs applied in electric vehicles are considerable in size and weight due to the inherent power requirements for transporting large payloads over long distances. Replacing battery components for repair can be time consuming and monetarily expensive. Ensuring quality manufacturing by use of modern test systems can mitigate repair requirements and extend the longevity of battery packs.

Conventional approaches to testing a battery pack such as current pulse generation and degeneration along with analysis on thermography signatures of the pack are meant to detect connector and wiring continuity. However, test equipment relating to these conventional approaches are expensive and tend to operate with high-voltage and high-power demands, thereby introducing safety concerns and elevating infrastructure requirements.

SUMMARY

Systems and methods in accordance with various embodiments of the present disclosure may overcome one or more of the aforementioned and other deficiencies experienced in conventional approaches to detecting defects associated with a power source, such as a battery cell. In particular, various embodiments describe approaches for testing power sources and/or power source connection components. For example, a battery system can include battery packs which comprise a plurality of battery modules. Battery modules may be formed by a number of individual battery cells or may themselves be individual battery cells depending on the configuration of the battery module. A battery cell can be electrically coupled to a conducting bridge, such as a bus bar, via a power source connection component. An example power source connection component includes a wire bond or tab.

A probe system includes measurement components configured to measure parameters of power sources and/or power source connection components (collectively referred to as "battery components"). The measurement components can include, for example, a probe station having a plurality of probes. Parameters can include, for example, s-parameters such as amplitude and phase of a signal.

A signal generator such as a frequency synthesizer can generate a signal that passes through a battery system. The measurement components of the probe system can measure a signal transmitted to the battery system. For example, a probe of the measurement components can obtain reflected signals.

The reflected signals can be analyzed by a signal processing system. The signal processing system can generate an output indicative of a condition of a power source (e.g., a battery cell) and/or a power source connection component (e.g., a battery cell connection component). In various embodiments, the signal processing system utilizes trained models and frequency domain reflectometry and other appropriate techniques to identify a battery defect such as a continuity defect and the location of such defects within a battery system.

A reporting system provides the output. The output can include, for example, an indication whether there a defect is associated with a battery component. In various embodiments, the output can include a classification of the frequency response used to determine the defect(s). Example classifications include "no defect," "defect," or some other classification. In various embodiments, the output includes a visualization indicative of the classification. This can include, for example, graphical elements depicting the classification and the location of the frequency response measured at each probe, the impacted battery components, and the like.

In some aspects, the techniques described herein relate to an apparatus for testing battery cells connected in a battery pack, the apparatus including: a signal generator configured to apply a signal to the battery pack, wherein the battery pack includes a plurality of battery modules, individual battery modules including at least one battery cell, the plurality of battery modules and battery cells being electrically coupled to a conducting bridge via a connection component; a DC block coupled to the signal generator and configured to pass the signal while isolating high-DC voltages from the battery pack; a probe selection component electrically coupled to a plurality of measurement components, individual measurement components operable to electrically couple to measurement points on the battery pack; and a digital signal processing component configured to determine a signature of a reflected signal obtained at one of the measurement points, the signature being compared to a baseline signature to determine whether a continuity defect is present, and wherein a frequency-domain reflectometry technique is used to locate the continuity defect.

In some aspects, the techniques described herein relate to an apparatus, wherein the conducting bridge includes a bus bar.

In some aspects, the techniques described herein relate to an apparatus, wherein the connection component includes one of a wire bond or a tab.

In some aspects, the techniques described herein relate to an apparatus, wherein the DC block includes one of an opto-isolators or an inductor.

In some aspects, the techniques described herein relate to an apparatus, wherein the probe selection component includes one of a MUX or a robotic arm.

In some aspects, the techniques described herein relate to an apparatus, further including: a trained model operable to determine the baseline signature.

In some aspects, the techniques described herein relate to an apparatus, wherein the trained model is operable to classify a signal deviation measured at corresponding probe points of different battery packs.

In some aspects, the techniques described herein relate to an apparatus, further including: a trained model operable to recognize a baseline battery pack.

In some aspects, the techniques described herein relate to a method for testing battery cells connected in a battery pack, the method including: selecting a measurement component from a plurality of measurement components, the measurement component being coupled to a measurement point associated with the battery pack; applying an input signal to the battery pack, wherein the battery pack includes a plurality of battery modules, individual battery modules including at least one battery cell, the plurality of battery modules and the battery cells being electrically coupled to a conducting bridge via a connection component; measuring a reflected signal by the measurement component at the measurement point, the reflected signal being associated with signal parameters; determining a signature based on the signal parameters, the signature being representative of the reflected signal; calculating a difference between the signature and a stored signature for the measurement point to generate a difference value; comparing the difference value to a threshold; classifying the reflected signal; and determining whether there is a continuity defect.

In some aspects, the techniques described herein relate to a method, further including: recognize the continuity defect; and using a frequency domain reflectography technique to determine a location of the continuity defect.

In some aspects, the techniques described herein relate to a method, further including: applying a fast Fourier transform technique on the reflected signal to determine an electrical distance to the continuity defect; determining a distance-to-fault value based on the electrical distance; and determining a location of the continuity defect based on the distance-to-fault value.

In some aspects, the techniques described herein relate to a method, further including: obtaining training data, the training data including expected signal data obtained at one or more probe points of a baseline battery pack; and training a model to generate a baseline model to recognize the expected signal data in reflected signal data.

In some aspects, the techniques described herein relate to a method, further including: applying the baseline model to the reflected signal; and determining whether the continuity defect is present.

In some aspects, the techniques described herein relate to a method, further including: obtaining training data, the training data representing a signal deviation from a first probe point associated with a first battery cell and a corresponding second probe point associated with a second battery cell, the first battery cell associated with a first battery pack and the second battery cell associated with a second battery pack; and training a model to generate a deviation model to recognize an acceptable signal deviation for corresponding probe points of different battery packs.

In some aspects, the techniques described herein relate to a method, further including: applying the deviation model to signal deviation measured between different battery packs at corresponding probe points, the different battery packs including a baseline battery pack and a test battery pack; and determining a classification of the test battery pack.

In some aspects, the techniques described herein relate to a method, wherein the classification indicates a baseline battery pack.

In some aspects, the techniques described herein relate to a non-transitory computer readable storage medium storing instructions that, when executed by at least one processor of a computing system, causes the computing system to: select a measurement component from a plurality of measurement components, the measurement component being coupled to a measurement point associated with a battery pack; apply a signal to the battery pack, wherein the battery pack includes a plurality of battery modules, individual battery modules including at least one battery cell, the battery modules and the battery cells being electrically coupled to a conducting bridge via a connection component; measure a reflected signal by the measurement component at the measurement point, the reflected signal being associated with signal parameters; determine a signature based on the signal parameters, the signature being representative of the reflected signal; calculate a difference between the signature and a stored signature for the measurement point to generate a difference value; compare the difference value to a threshold; classify the reflected signal; and determine whether there is a continuity defect.

In some aspects, the techniques described herein relate to a non-transitory computer readable storage medium, wherein the instructions, when executed by the at least one processor, further enables the computing system to: recognize the continuity defect; and use a frequency domain reflectography technique to determine a location of the continuity defect.

In some aspects, the techniques described herein relate to a non-transitory computer readable storage medium, wherein the instructions, when executed by the at least one processor, further enables the computing system to: apply a fast Fourier transform technique on the reflected signal to determine an electrical distance to the continuity defect; determine a distance-to-fault value based on the electrical distance; and determine a location of the continuity defect based on the distance-to-fault value.

In some aspects, the techniques described herein relate to a non-transitory computer readable storage medium, wherein the instructions, when executed by the at least one processor, further enables the computing system to: training a first model to generate a baseline model to recognize expected signal data in reflected signal data; and training a second model to generate a deviation model to recognize an acceptable signal deviation for corresponding probe points of different battery packs.

Embodiments provide a variety of advantages. For example, in accordance with various embodiments, instead of exposing testing systems to high currents, which can be expensive to manage as well as dangerous to operate, a network analyzer can be used at the probe level to generate alternating currents at low voltages to more safely identify battery defects including, for example, continuity defects. Moreover, the present invention provides for the reduction in weight, size, power, and cost of a testing system when compared to conventional battery testing systems. Further still, the present invention contemplates trained models to optimize the detection of continuity defects, further reducing costs and providing for increased resource management.

Various other functions and advantages are described and suggested below as may be provided in accordance with the various embodiments.

BRIEF DESCRIPTION OF THE DRAWING FIGURES

The accompanying drawings illustrate several embodiments and, together with the description, serve to explain the principles of the invention according to the embodiments. It will be appreciated by one skilled in the art that the particular arrangements illustrated in the drawings are merely exemplary and are not to be considered as limiting of the scope of the invention or the claims herein in any way.

DETAILED DESCRIPTION

Figure 1:
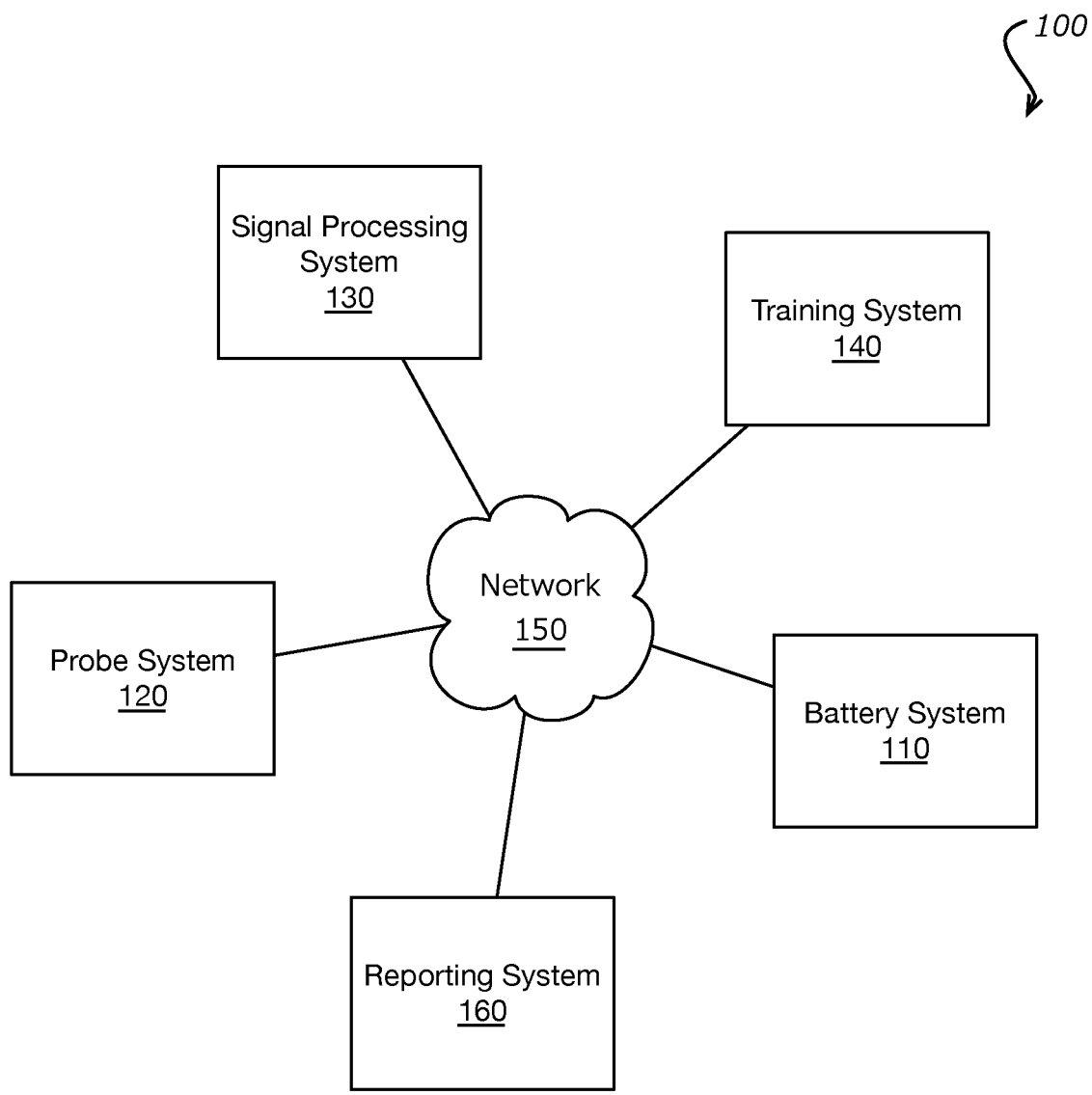
FIG. 1 illustrates an example environment in which aspects of the various embodiments can be implemented.

One or more different embodiments may be described in the present application. Further, for one or more of the embodiments described herein, numerous alternative arrangements may be described; it should be appreciated that these are presented for illustrative purposes only and are not limiting of the embodiments contained herein or the claims presented herein in any way. One or more of the arrangements may be widely applicable to numerous embodiments, as may be readily apparent from the disclosure. In general, arrangements are described in sufficient detail to enable those skilled in the art to practice one or more of the embodiments, and it should be appreciated that other arrangements may be utilized and that structural, logical, software, electrical and other changes may be made without departing from the scope of the embodiments. Particular features of one or more of the embodiments described herein may be described with reference to one or more particular embodiments or figures that form a part of the present disclosure, and in which are shown, by way of illustration, specific arrangements of one or more of the aspects. It should be appreciated, however, that such features are not limited to usage in the one or more particular embodiments or figures with reference to which they are described. The present disclosure is neither a literal description of all arrangements of one or more of the embodiments nor a listing of features of one or more of the embodiments that must be present in all arrangements.

Headings of sections provided in this patent application and the title of this patent application are for convenience only and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible embodiments and in order to more fully illustrate one or more embodiments. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the embodiments, and does not imply that the illustrated process is preferred. Also, steps are generally described once per aspect, but this does not mean they must occur once, or that they may only occur once each time a process, method, or algorithm is carried out or executed. Some steps may be omitted in some embodiments or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other embodiments need not include the device itself.

Techniques and mechanisms described or referenced herein will sometimes be described in singular form for clarity. However, it should be appreciated that particular embodiments may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various embodiments in which, for example, functions may be executed out of order from that shown or discussed, including substantially concurrently or in reverse order, depending on the functionality involved, as would be understood by those having ordinary skill in the art.

It should be noted that although the techniques described herein may be used for a wide variety of users and intervention requests, for clarity of presentation, examples of companies providing electric vehicles will be used. The techniques described herein, however, are not limited to batteries used in electric vehicles, and power sources associated with other devices are contemplated in accordance with the various embodiments described herein.

Conceptual Architecture

FIG. 1 illustrates an example environment 100 in which aspects of the various embodiments can be implemented. It should be understood that reference numbers are carried over between figures for similar components for purposes of simplicity of explanation, but such usage should not be construed as a limitation on the various embodiments unless otherwise stated. As shown, the environment may comprise battery system 110, probe system 120, signal processing system 130, training system 140, and reporting system 160. It should be known that the various systems and components described herein are exemplary and for illustration purposes only. The components may be reorganized or consolidated, as understood by a person of ordinary skill in the art, to perform the same tasks on one or more other servers or devices without departing from the scope of the invention. Other components may be used, as would be readily understood by a person of ordinary skill in the art, without departing from the scope of the embodiments described herein.

Battery system 110 can include battery packs which comprise a plurality of battery modules. The battery system 110 is described in greater detail in FIG. 5, but in general, battery packs accept, store, and release electricity on demand and can consist of a plurality of battery modules. Battery modules may be formed by a number of individual battery cells or may themselves be individual battery cells depending on the configuration of the battery. In an embodiment, the battery modules can be arranged in series or parallel. A battery cell can be electrically coupled to a conducting bridge, such as a bus bar, via a power source connection component. An example power source connection component includes a wire bond, tab, and the like. The battery packs can be used to store energy for various applications, such as power storage for autonomous vehicle platforms, power storage for residential and/or commercial property, portable electronics, power storage for renewable energy distribution, backup power sources for cellular phone sites, power sub stations, electric vehicles, etc.

Probe system 120 includes measurement components configured to measure parameters of battery components. The measurement components can include, for example, a probe station having a plurality of probes. A probe can include a cable. A probe can wirelessly communicate with the probe station. A probe can comprise a RF probe, single and differential probes, or any other probe know in the art for receiving RF signals. A probe can measure signal data (e.g., signal parameters) obtained from the battery system. For example, a probe can collect reflected signals transmitted by an RF system, such as vector network analyzer (VNA) or another appropriate vector network analyzer, and can identify one or more signal parameters. The signal parameters can include, for example, s-parameters such as amplitude and phase of a signal, among other such parameters. The probes can be electrically coupled to one or more probe points of a battery pack. A probe point can include, for example, a particular area of the battery pack. In an example, a probe point can be located proximate to a power source connection component, including at the power source connection component.

Signal processing system 130 can process signal data to identify continuity defects associated with a battery pack. Processing signal data can include generating signatures of signals, comparing signal data, analyzing signal data using trained models to detect continuity defects, analyzing signal data using frequency domain reflectometry and other appropriate techniques to locate defects, etc.

A continuity defect can be associated with a battery component. A continuity defect can include a break or reduction in the flow of current. That is, a continuity defect can indicate a whether a circuit is open or closed. Information for a detected defects can be provided to an appropriate system and/or component for further processing. For example, information about the defect can be analyzed to determine whether a battery cell and/or power source connection components should be repaired and/or replaced.

In an embodiment, signal processing system 130 can include or be in communication with a network analyzer such as a vector network analyzer (VNA), a frequency synthesizer, a signal processing component, and storage. It should be noted that the components may be reorganized or consolidated, as understood by a person of ordinary skill in the art.

The frequency synthesizer can generate a range of frequencies from a single reference frequency. This can include, for example, alternating current (AC) waveforms such as continuous waves (CWs), including, for example, sinusoidal waves. In another embodiment, frequency synthesizer can generate an arbitrary waveform. In another embodiment, the frequency synthesizer can generate a high frequency swept signal. In yet another embodiment, the frequency synthesizer can generate a unique waveform signature across varying frequencies generated in a step-mode fashion. The range of frequencies can be used as an input signal, for example, to a battery system.

The input signal generated by the frequency synthesizer passes through a battery system, and the reflections due to impedance mismatch and open/closed circuits associated with the battery system can be obtained by probe system 120 and measured by the network analyzer. That is, the network analyzer is operable to measure parameters of battery components. For example, the network analyzer can measure the frequency response of a battery pack or components of the battery pack (e.g., battery modules, battery cells, and/or power source connection components) at one or more probe points. The measured frequency response can be associated with one or more parameters. A parameter can include, for example, amplitude of the measured signal, phase of the measured signal, etc. A signature of the measured signal can be determined. The signature can be based on the measured signal parameters of the signal at a probe point. It should be noted that any one of a number of techniques known in the art can be utilized to generate signatures of the measured signals. The signatures can be time or frequency signatures.

Signal processing system 130 can analyze and classify the frequency response measured at each probe point. The classification can indicate whether there is a defect. Example classifications include "no defect," "defect," or some other classification. Determining a classification can include, for example, comparing (e.g., subtracting, determining a difference) a measured signature to a baseline signal response to generate a difference signal. The difference signal between the measured signature and the baseline signature can be compared to a threshold to determine whether a defect is present. In the situation the difference signal satisfies the threshold, the measured signature can be classified as "no defect". In the situation the difference signal fails to satisfy the threshold, the measured signature can be classified as "defect". The difference signal can include a value or vector of values. In various embodiments, the difference signal can include a weighted combination of values, average combination of values, etc.

Signal processing system 130 can further utilize a frequency domain reflectography (FDR) technique to locate defects associated with battery components. Locating defects can include determining a location in a battery system for each defect, where the location can include the probe point where the signal was obtained, the location of the defective battery component, and/or some other location operable to indicate a defect location.

Training system 140 is operable to generate models and/or features for the models for characterizing signal data. In an embodiment, the signal data can be measured at one or more probe points, where a probe point can correspond to a location within a battery system. In an example, the probe points can correspond to locations in a baseline battery pack, the baseline battery pack representing a ground truth. More specifically, the signals measured at one or more probe points of the baseline battery pack represent expected signals.

In an embodiment, a model can represent a baseline (e.g., calibrated golden unit or expected) signal response ("signature") for battery packs by one or more manufacturers at one or more probe points. The baseline signatures can be associated with metadata identifying a battery pack, manufacturer, location within a battery pack, etc. The model can be stored in one or more data stores. The model can be used by, for example, signal processing system 130 to classify the frequency response measured at each probe of a battery pack under test.

In an embodiment, establishing a baseline signal can include, for example, obtaining expected signatures and using the expected signatures to train a model to identify those expected signatures. The expected signatures can be obtained in number of ways. In an example, a signature of an arbitrary waveform through a conductive wire can be obtained. In this example, the signature can be obtained using a control or reference battery pack. For example, the reflections at one or more probe points can be measured. The reflected signal can be associated with one or more signal parameters, which can include s-parameters such as amplitude and phase of a signal, among other such parameters. In another example, the signature of the arbitrary waveform through the conductive wire may be known. For example, the signature can be provided by a manufacturer of the battery, a third party, and the like.

The signatures can then be stored and used to train a model (e.g., a baseline model) for which defects (e.g., a break or reduction in the flow of current) can be detected for corresponding probe points and battery packs. For example, reflected signals at a probe point for a battery cell with no defects can be obtained. The reflected signals can be associated with particular signal parameters indicative of a battery cell with no defects affecting the probe point.

A model can be trained to recognize signals that include signal parameters indicative of a battery cell with no defects. For example, a model can represent the baseline signal for a probe point. Signal data can be measured at the probe point. A signature of the signal data can be determined. The signature can be subtracted from the baseline signal. The difference between the signature and the baseline signature can be compared to a threshold to determine whether a defect is present. In the situation the difference satisfies the threshold, the signature can be classified as "no defect". In the situation the difference fails to satisfy the threshold, the signature can be classified as "defect".

Such a process in accordance with various embodiments can be accomplished using various battery packs from a plurality of battery pack and/or battery cell providers.

In another embodiment, a model can classify the signal deviation between different battery packs at one or more probe points, where the different battery packs can include a baseline battery pack and a test battery pack. In certain embodiments the signal deviation can be used to learn and set acceptable deltas or thresholds that can be used to select battery packs for generating baseline signatures. For example, the signal response at corresponding probe points may be different for battery packs from the same manufacturer. Similarly, the signal response at corresponding probe points can be different for battery packs from different manufacturers. In accordance with various embodiments, models can be trained to characterize a test battery pack as a "good" or baseline battery pack, where a baseline battery pack is operable to generate baseline signatures. Similarly, a model can be trained to characterize a test battery pack as a "bad" or "undesirable" battery pack, where an undesirable battery pack is not suitable for generating baseline signatures. In these examples, the deviation of signatures of one battery pack from another battery pack at corresponding probe points can be the training data for the models. In the situation a model represents deviation across different battery packs, the trained model can be used to characterize a baseline signal response. In the situation a battery pack satisfies an acceptability threshold, the battery pack can be classified as a "good" baseline battery pack. In the situation a battery pack fails to satisfy an acceptability threshold, the battery pack can be classified as an "undesirable" battery pack.

Training system 140 is operable to train a machine learning model from "offline" training data. Training data can include, for example, expected battery performance data from battery manufactures, measurement of an arbitrary waveform through a battery pack at various potential probe points, deviation of signatures of battery packs at one or more corresponding probe points, and the like. The measurements can be labeled. The label can specify the manufacturer, probe point or location, measurement classification, expected signal parameters, etc.

In an embodiment, training system 140 trains a model by batch processing the training data. Training system 140 may use any "offline" learning algorithm that may be known to a person of ordinary skill in the art without departing from the scope of the invention, including, large-scale distributed training of decision trees, linear and logistic models, unsupervised models (k-means), time series models, deep neural networks, etc.

Training system 140 may include a model configurator for configuring the training job. It may specify model type, hyper-parameters, data source reference, and feature DSL expressions, as well as compute resource requirements (the number of machines, how much memory, whether or not to use GPUs, etc.). Model type can specify whether the model represents a baseline signal response, the deviation across battery packs, etc. Data source reference can specify a source of the data used to train a model. Training system 140 may also include a performance evaluator, which may evaluate the model based on any number of evaluation methodologies that are known to a person of ordinary skill in the art, including, but not limited to ROC curve and PR curve, etc.

Reporting system 160 is operable to report an output. The output can include, for example, an indication whether there is a defect in a trace, connection component, etc. In various embodiments, the output can include a classification of the frequency response measured at one or more probes and/or for the battery system. Example classifications include "no defect," "defect," or some other classification. The output can include the expected output, measured output, difference between the expected output and measured output, and additional information. In various embodiments, the indication can include a visualization indicative of the condition of the battery cell and/or battery cell connection components. This can include, for example, one or more graphical elements depicting the classification and the location of the frequency response measured at each probe. In an embodiment, a graphical element can be associated with sound, color, text, icons, graphics, etc. In an embodiment, a wire diagram or other representation of the battery system can be provided. An overlay of the output can be provided with the wire diagram or other representation of the battery system. Graphical elements can emphasize one or more areas of the representation of the battery system. For example, graphical elements can highlight one or more areas of the representation of the battery system. The output can be provided to an authorized user, system component, or combination thereof.

Network 150 may facilitate communication between battery system 110, probe system 120, signal processing system 130, and training system 140. Network 150 can be an intranet, an extranet, a virtual private network (VPN), a local area network (LAN), a wireless LAN (WLAN), a wide area network (WAN), a metropolitan area network (MAN), a portion of the Internet, or another network 150 or a combination of two or more such networks 150. The present disclosure contemplates any suitable network 150 which allows battery system 110, probe system 120, signal processing system 130, and training system 140 to communicate on the premise (e.g., locally, for example, on a battery pack). In another example, communication between the components may be facilitated remotely (e.g., relayed to a cloud network). Network 150 may include on-premise databases. The on-premise databases may communicate with each other to collect, sort, store, and/or analyze signal data.

One or more links couple one or more systems, power storage devices, or other devices to the network 150. In particular embodiments, one or more links each includes one or more wired, wireless, or optical links. In particular embodiments, one or more links each includes an intranet, an extranet, a VPN, a LAN, a WLAN, a WAN, a MAN, a portion of the Internet, or another link or a combination of two or more such links. The present disclosure contemplates any suitable links coupling one or more systems, power storage devices, or devices to the network 150.

In particular embodiments, one or more data storages may be communicatively linked to one or more servers via one or more links. In particular embodiments, data storages may be used to store various types of information. In particular embodiments, the information stored in data storages may be organized according to specific data structures. In particular embodiment, each data storage may be a relational database. Particular embodiments may provide interfaces that enable servers or clients to manage, e.g., retrieve, modify, add, or delete, the information stored in data storage.

The system may also contain other subsystems and databases, which are not illustrated in FIG. 1, but would be readily apparent to a person of ordinary skill in the art. For example, the system may include databases for storing data, storing features, storing outcomes (training sets), and storing models. Other databases and systems may be added or subtracted, as would be readily understood by a person of ordinary skill in the art, without departing from the scope of the invention.

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit (ASIC), or on a network interface card.

Software/hardware hybrid implementations of at least some of the embodiments disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific embodiments, at least some of the features or functionalities of the various embodiments disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some embodiments, at least some of the features or functionalities of the various embodiments disclosed herein may be implemented in one or more virtualized computing environments (e.g., network computing clouds, virtual machines hosted on one or more physical computing machines, or other appropriate virtual environments).

The system may be reorganized or consolidated, as understood by a person of ordinary skill in the art, to perform the same tasks on one or more other servers or computing devices without departing from the scope of the invention.

Figure 2:
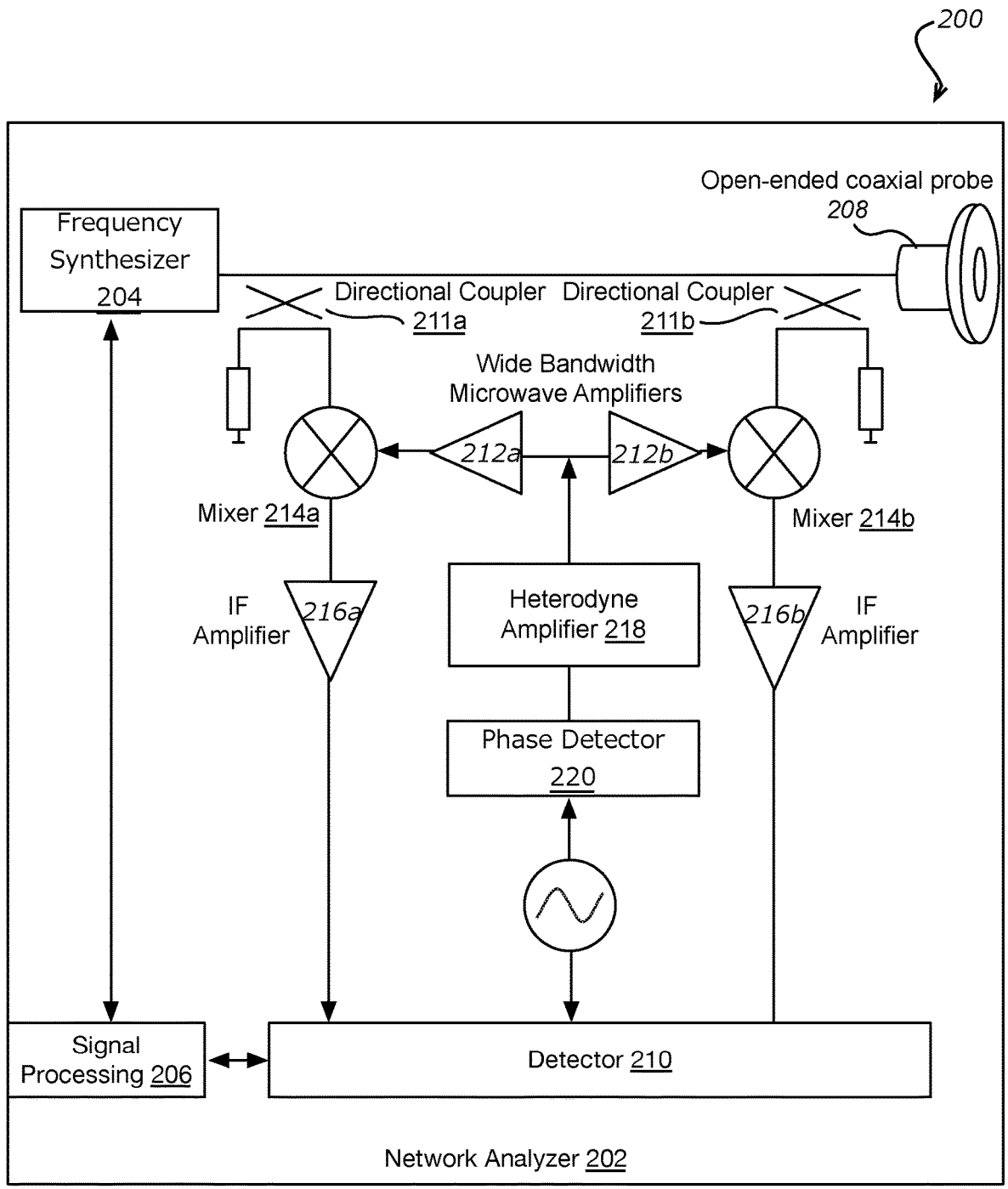
FIG. 2 illustrates an example of a digital signal processing system in accordance with an exemplary embodiment.

FIG. 2 illustrates an example 200 of signal processing system 130 in accordance with an embodiment. In this example, signal processing system 130 includes network analyzer 202, frequency synthesizer 204, signal processing component 206, detector 210, and at least one probe 208. Other components may be used, as would be readily understood by a person of ordinary skill in the art, without departing from the scope of the embodiments described herein. These components can include, couplers 211a and 211b, microwave amplifiers 212a and 212b, mixers 214a and 214b, IF amplifiers 216a and 216b, heterodyne amplifier 218, phase detector 220, among other such components. It should be noted that the components described herein are exemplary and for illustration purposes only. The components may be reorganized or consolidated, as understood by a person of ordinary skill in the art, to perform the same tasks on one or more other servers or devices without departing from the scope of the invention.

Frequency synthesizer 204 can generate a range of frequencies from a single reference frequency. This can include, for example, alternating current (AC) waveforms such as continuous waves (CWs), including, for example, sinusoidal waves. In another embodiment, frequency synthesizer 204 can generate an arbitrary waveform. In another embodiment, frequency synthesizer 204 can generate a high frequency swept signal. In yet another embodiment, frequency synthesizer 204 can generate a unique waveform signature across varying frequencies generated in a step-mode fashion.

Probe 208 can comprise a RF probe, single and differential probes, or any other probe know in the art for receiving RF signals. Probe 208 can be part of measurement circuitry or measurement components for a probe system. Probe 208 can measure parameters of a battery system. This can include parameters of one or more battery modules or one or more battery cells. For example, probe 208 can measure parameters of the conductive material between battery cells and/or collection of battery cell or battery modules. In an example, probe 208 can be electrically coupled to busbars, welds, laser weld points, fuses, wire bonds, etc. Parameters can include s-parameters such as amplitude and phase of a signal, among other such parameters. Probe 208 can be electrically coupled to one or more probe points of a battery pack. Probe 208 can measure signal data signal data transmitted to the battery pack. For example, probe 208 can collect reflected signals transmitted by frequency synthesizer 204.

Signal processing component 206 can identify continuity defects associated with the battery packs using frequency-domain reflectometry and other appropriate techniques. Signal processing component can obtain phase and amplitude parameters for incident and reflected signals from detector 210. Signal processing component 206 can utilize a frequency-domain reflectometry technique to technique to locate defects associated with the battery components. Locating defects can include determining a location in a battery system for each defect, where the location can include the probe point where the signal was obtained, the location of the defective battery component, and/or some other location operable to indicate a defect location. Information for the detected defects can then be provided to an appropriate system and/or component for further processing.

In one example, signal processing component 206 selects a probe point. A probe point can include, for example, a particular area of a battery pack. In an example, a probe point can be located proximate to a battery component, including at the battery component. The probe point can be manually selected, selected in response to an event or series of events, selected in accordance with a schedule or interval, selected based on a configuration file or other information, etc.

Probe 208 can be grounded to a battery module. Probe 208 is electrically coupled to a busbar of the battery module.

Frequency synthesizer 204 generates an arbitrary waveform. The arbitrary waveform is passed down the path of the busbar to a battery cell of the battery module. The received/reflected signal is a function of voltage standing wave ratio (VSWR). In the situation there is a broken wire bond or welded conductor bound operable to couple the battery cell to the wire bar, a reflection of the arbitrary waveform can be obtained. In the situation there is a shorted/closed circuit, no or reduced reflections are measured. In any situation, a measurement of the signal at the probe point is obtained and a signature of the measured signal is determined. The signature can be based on the measured signal parameters of the signal at the probe point. It should be noted that any one of a number of techniques known in the art can be utilized to generate signatures of the measured signals. The signatures can be time or frequency signatures.

The signature is compared to a baseline signature to generate a difference signal. The difference signal can include a value or vector of values. In various embodiments, the difference signal can include a weighted combination of values, average combination of values, etc. The baseline signature can be for battery packs by one or more manufactures. The baseline signatures can include signatures for battery packs at a plurality of probe points. The baseline signatures can be associated with metadata identifying a battery pack, manufacturer, location within a battery pack, etc.

The difference between the measured signature and the baseline signature can be compared to a threshold to determine whether a defect is present. In an embodiment, the threshold can be manually determined, determined from a trained machine learning model, and/or a combination thereof. The threshold can be dynamically updated. For example, the threshold can be updated periodically and/or in response to an event. In another example, the threshold can be updated based on the manufacturer of the battery pack.

In the situation the difference signal satisfies the threshold, the measured signature can be classified as "no defect". In the situation the difference signal fails to satisfy the threshold, the measured signature can be classified as "defect".

Signal processing component 206 can further utilize a frequency domain reflectography (FDR) technique to locate defects associated with battery components. Locating defects can include determining a location in a battery system for each defect, where the location can include the probe point where the signal was obtained, the location of the defective battery component, and/or some other location operable to indicate a defect location. In general, the FDR technique requires that a frequency oscillator of frequency synthesizer 204 feed a swept-frequency signal into a transmission line of the battery system. Signal processing component, e.g., a radio frequency receiver, measures the interference pattern generated when the swept RF source output signal adds and subtracts with reflected signals from faults and other reflective characteristics within the tested transmission line. The vector addition of the signals creates a ripple pattern vs. frequency. A fast Fourier transform (FFT) calculates the distance-to-fault.

The number of ripples in the return loss (or power) vs. frequency display is directly proportional to the electrical distance to the reflective point on the transmission line.

The electrical distance is related to physical distance according to the propagation velocity, kp. Cables with different dielectric types maintain different electrical propagation speeds. In the following equation, the integer number of displayed ripples, n, relates to fault location, L, according to:

$$L=(n*c*kp)/(2*[DELTA]f)$$

where c=speed of light [DELTA] f=frequency sweep width

Thus, the FDR analyzer's distance accuracy is determined by knowledge of the cable's propagation velocity.

It should be noted that although signal processing component 206 is shown inside network analyzer 202, signal processing component 206, in accordance with various embodiments, can both be included in network analyzer 202, while in other embodiments, signal processing component 206 can be included in a remote network analyzer. For example, signal processing component 206 can be part of network analyzer 202. In another example, signal processing component 206 can be remote of network analyzer 202. In yet another example, signal processing component can be distributed between network analyzer 202 and one or more other computing systems.

Figure 3:
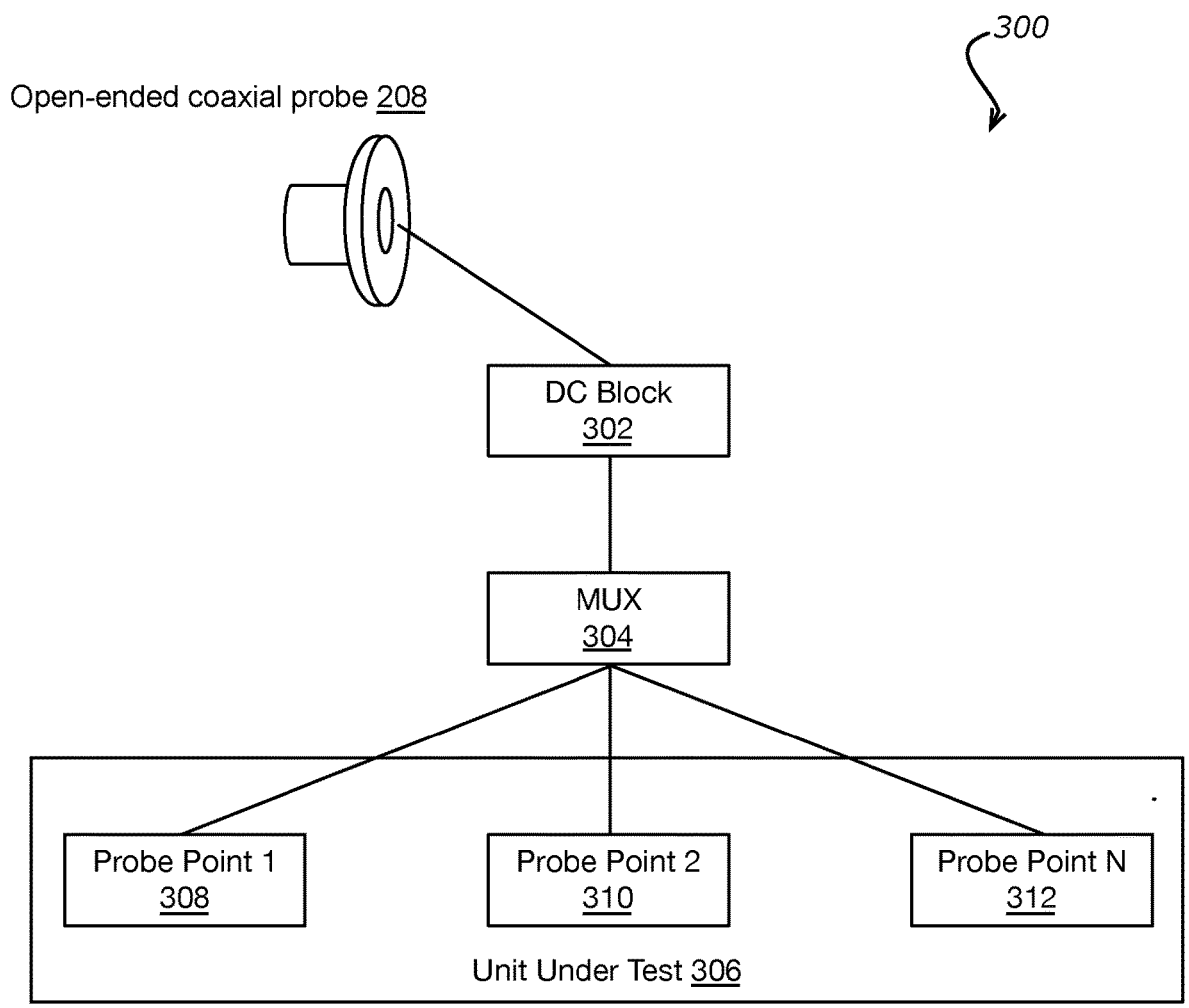
FIG. 3 illustrates an example testing station in accordance with an exemplary embodiment.

FIG. 3 illustrates an example 300 of a testing station in accordance with an embodiment. In this example, the testing station includes probe 208, DC block 302, mux 304, and unit under test 306. Unit under test 306 can include battery components of battery system 110. For example, unit under test 306 can include one or more battery modules that include one or more battery cells, battery connection components, and the like.

DC block 302 is configured to isolate a high voltage DC component from the AC component. In particular, DC block 302 is configured to pass higher frequency signals from frequency synthesizer 204, while isolating high-DC voltages (e.g., 400 volts) from the unit under test 306 (e.g., a battery pack) from entering network analyzer 202 and/or other system components. In this way, DC block 302 effectively operates as a bandpass filter, allowing AC signals to pass through and reflecting and blocks the high voltage DC delta between network analyzer 202 and/or other components and unit under test 306. It should be noted that components other than DC block 302 may be used to isolate high-DC voltages, including, for example, opto-isolators, inductors, and the like.

Multiplexor/Mux 304 is operable to obtain signal readings at multiple probe points. In an example, network analyzer 202 may be limited to a certain number of probes, thereby limiting the number of probe points that may be measured. Mux 304 can be used to increase the number of probe points measured. For example, in the situation network analyzer 202 includes a single probe and can measure signals at a single probe point, mux 304 can be used to measure probe point 1 308, probe point 2 310, and probe point N 312. In this example, Mux 304 is coupled to a plurality of probes, each probe coupled to a probe point. Mux 304 can then automatically (or manually) obtain signal measurements in accordance with a measurement scheme, trigger, randomly, or a combination thereof. In certain embodiments, a robotic arm or other such component or device can be utilized to select probe points.

In an embodiment, the system can optimize execution by triggering at the hardware level the multiplexing transition between one probe point to the next. In an example, a transition can include mux 304 obtaining a measurement at probe point 1 308, then mux 304 obtaining a measurement at probe point 2 310, and so on. In an embodiment, mux 304 can obtain a measurement at a probe point based on a trigger signal. For example, for a signal at a first frequency, mux 304 can obtain a reading at probe point 1 308. For a signal at a second frequency, mux 304 can obtain a reading at probe point 2 310. The obtained can be processed by signal processing component 206 or another appropriate component.

Figure 4:
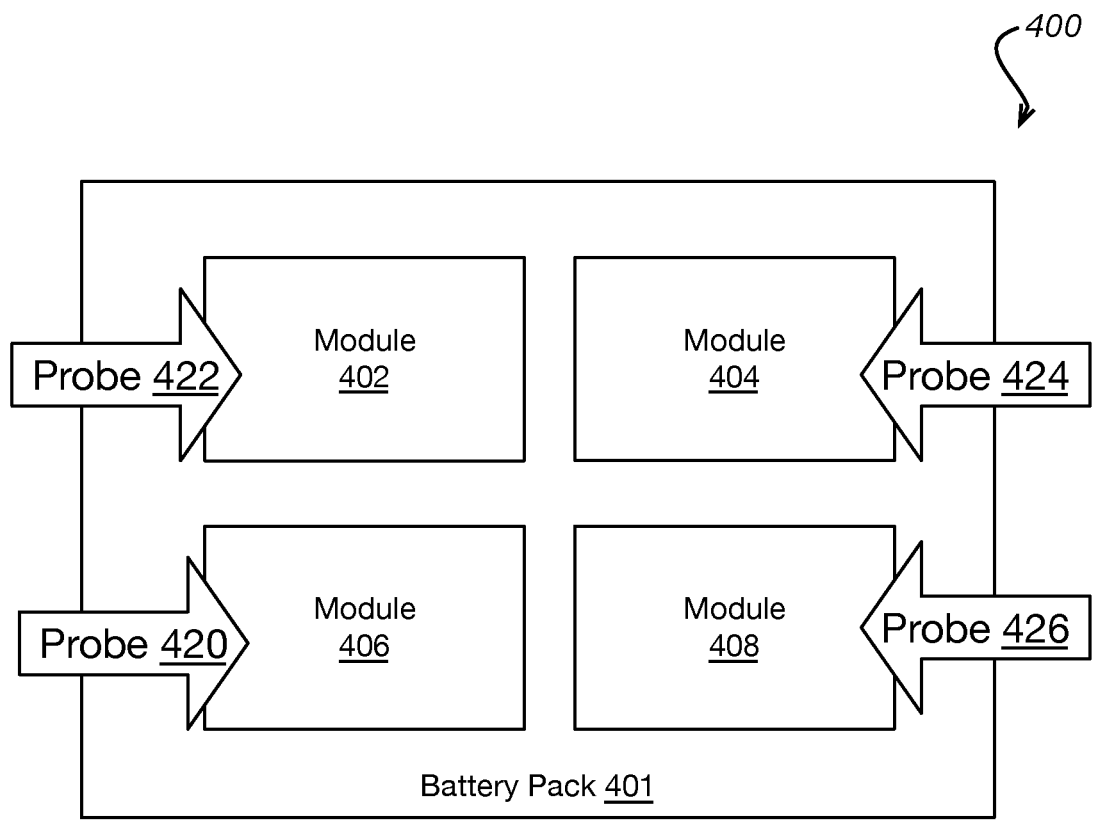
FIG. 4 illustrates example placement of measurement components in accordance with various embodiments.

FIG. 4 illustrates an example 400 of probe placement in accordance with an embodiment. As shown in FIG. 4, example a battery system includes battery pack 401. It should be noted that although a single battery pack is shown, the battery system can include additional battery packs. Battery pack 401 includes a group of battery modules (e.g., battery module 402, battery module 404, battery module 406, and battery module 408). Battery modules may be formed by a number of individual battery cells or may themselves be individual battery cells depending on the configuration of the battery module. A battery cell can be electrically coupled to a conducting bridge, such as a bus bar, via a power source connection component. An example power source connection component includes a wire bond or tab.

Probe 420, probe 422, probe 424, and probe 426 can be coupled to respective probe points of battery pack 401. In an embodiment, a probe point corresponds to a location where a probe contacts the battery pack. In an embodiment, there can be additional or fewer probes and/or probe points. A probe point can be located proximate to a power source connection component (e.g., a wire bond or tab), including at the power source connection component. A probe point in certain embodiments can be located at any appropriate location of the batter pack. An example location includes a location where signals transmitted to the battery pack can be measured. This can include, for example, reflected signals of a transmitted signal from a signal generator such as a frequency synthesizer.

Locations of probe points can be updated. For example, a probe point can be changed from one location to another location of the battery pack. A probe point location can be added and/or removed.

Figure 5:
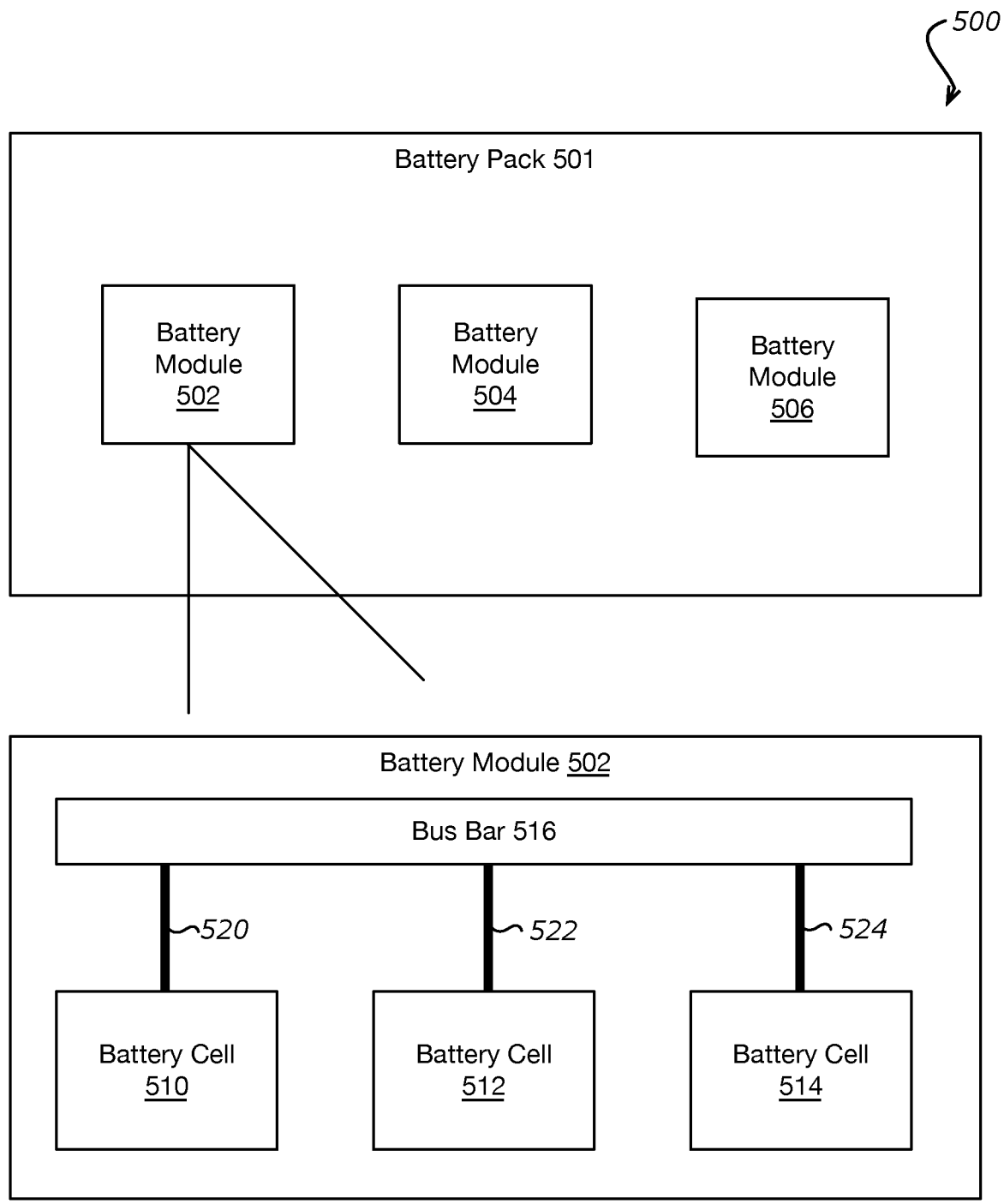
FIG. 5 illustrates an example battery system in accordance with an exemplary embodiment.

FIG. 5 illustrates an example 500 of a battery system in accordance with an embodiment. As shown in FIG. 5, the battery system includes battery pack 501. Battery pack, in this example, includes battery module 502, battery module 504, and battery module 506. The battery modules can be electrically coupled. For example, battery module 502 can be electrically coupled to each of battery module 504 and battery module 506, battery module 504 can be electrically coupled to each of battery module 502 and battery module 506, and battery module 506 can be electrically coupled to each of battery module 502 and battery module 504. It should be appreciated that more or fewer battery modules can be included in embodiments described with respect to FIG. 5, and the battery modules can be connected in one of a number of different combinations, including, for example, in series, in parallel, and a combination thereof. In an embodiment, one or more battery packs are in electric vehicles, backup power sources for cellular phone sites, power sub stations, etc.

Battery modules may be formed by a number of individual battery cells or may themselves be individual battery cells depending on the configuration of the battery module. A battery cell can be electrically coupled to a conducting bridge, such as a bus bar, via a power source connection component. An example power source connection component includes a wire bond or tab. For example, battery module 502 can include battery cell 510, battery cell 512, and battery cell 514. The battery cells can be electrically coupled to a conducting bridge, such as bus bar 516, via a connection component. For example, battery cell 510 is electrically coupled to bus bar 516 by connection component 520, battery cell 512 is electrically coupled to bus bar 516 by connection component 522, and battery cell 514 is electrically coupled to bus bar 516 by connection component 524. An example connection component includes a wire bond or tab. Battery pack 501 can have a capacity that is greater than a single battery cell, such as battery cell 510.

Figure 6:
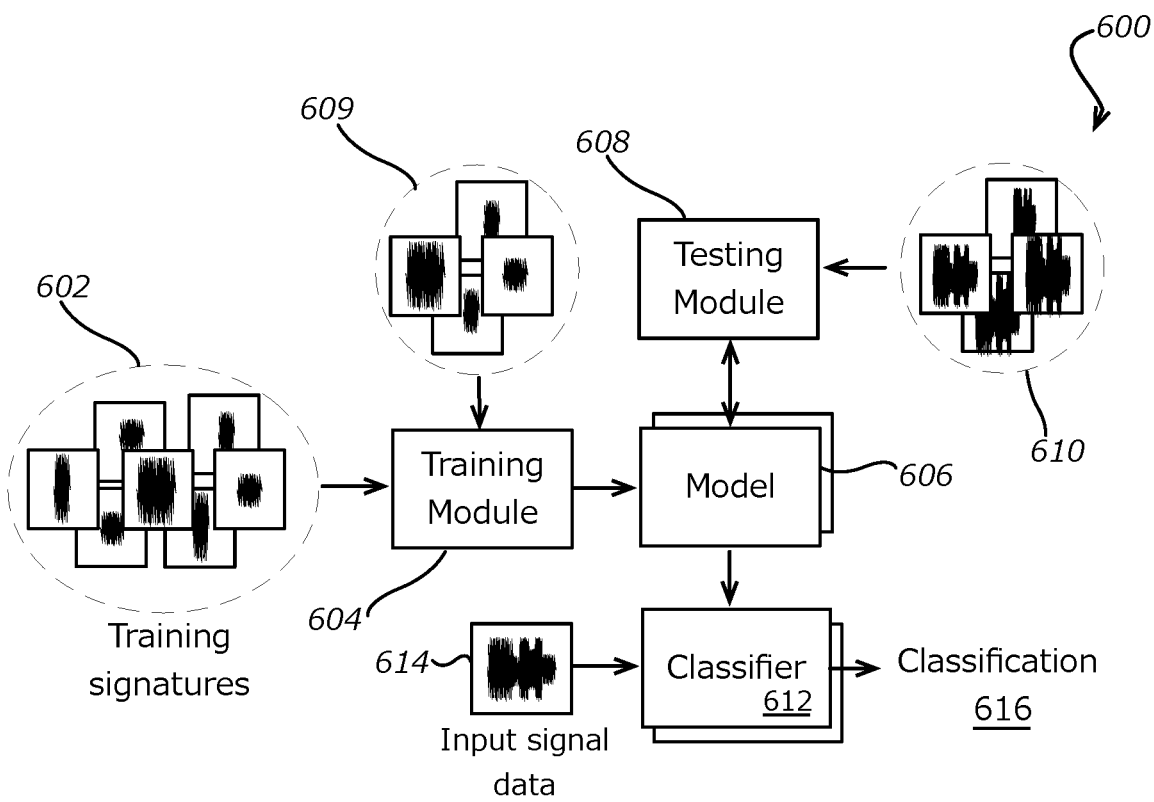
FIG. 6 illustrates an example approach to training a model to identify continuity defects that can be utilized in accordance with various embodiments.

As described, training system 140 is operable to generate models and/or features for the models for characterizing battery packs and/or areas of battery packs. FIG. 6 illustrates an example classification pipeline 600 that can be utilized in accordance with various embodiments. In an embodiment, training module 604 can be utilized to train a model operable to represent a baseline signal response for different battery packs. In this example, training data 602 can be used to train one or more models to classify signals obtained at one or more probe points. Training data 602 can include the signature of an arbitrary waveform through a conductive wire for a battery pack at one or more probe points. In an embodiment, the signature can be provided by a manufacturer of the battery, a third party, and the like. In various embodiment, the signature can be obtained using a control or reference battery pack. For example, the reflections at one or more probe points can be measured. The reflected signal at each probe point can then be stored and used to train a model (e.g., a baseline model) for which defects (e.g., a break or reduction in the flow of current) can be detected for corresponding probe points and battery packs.

Additionally or alternatively, training data 609 can be used to train one or more models to classify the signal deviation between different battery packs at corresponding probe points. In this example, training data 609 can include signal deviation classified as, for example, "undesirable" or "desirable", where a classification as desirable can correspond to a battery pack useful in determining baseline signatures and/or use and a classification as undesirable can correspond to a battery pack not useful in determining baseline signatures and/or use. In various embodiments, the signal deviation can be used to determine acceptable thresholds of signal deviation. In this example, the signal deviation between one or more corresponding probe points of an unknown battery pack and a baseline battery pack can be compared to a threshold to classify the unknown battery pack. Signal deviation in accordance with various embodiments can be determined by comparing one or more parameters of signals measured at one or more corresponding probe points of different battery packs manufactured by the same manufacturer. The parameters can include, e.g., amplitude of the measured signal, phase of the measured signal, etc. The signals can be obtained from verified baseline battery packs.

In order to function as training data for one or more models or neural networks, or other such machine learning algorithms, at least some of the signal measurements (including, e.g., deviation signal measurements) will include (or be associated with) data that indicates a type or classification of signal data represented in each measurement. For example, the frequency response measured at each probe point can be associated with a classification that indicates whether there is a defect in a trace, connection component, etc. Example classifications include "no defect," "defect," or some other classification. In another example, the signal deviation determined at each probe point can be associated with a classification that indicates whether a battery pack is useful in determining baseline signatures and/or use.

In some embodiments the signal measurements will be analyzed to determine which signals are sufficient to characterize a signal, and those signal measurements can be considered part of the training set to be used to train the models. In at least some embodiments there is one classification layer of such networks including, for example, a multi-class classifier trained for each category or classification of signals, with multiple types of classifications of that type of signal being possible outcomes from the model. In some embodiments a portion of the training set will be retained as a testing set 610 to use to test the accuracy of the trained neural network.

In this example, the training signals are accessible to a training module 604 which can feed the signals to a model 606 in order to train the model. As mentioned, the signals and classification data will be fed to the model so the model can learn features associated with different classifications of signals. The model can then learn various combinations or relations of features for different classifications, such that when input signal data is processed with the trained model, the model can recognize the features and output the appropriate classification, although various other approaches can be utilized as well within the scope of the various embodiments.

In some embodiments, training data 602 and training data 609 is used as training data for a convolutional recurrent neural network, deep neural network, or other type of neural network or model. As mentioned, the signatures can be classified, either when provided or through a classification analysis, to determine a primary classification, such as "no defect", "defect", "desirable", "undesirable", etc. Various other signal data (e.g., signatures, deviation signal data, and the like) provided by third party sources or generated from battery packs provided by third parties can be used for training as well as discussed and suggested elsewhere herein. The models can be trained using some or all of the designated training data. Once at least the initial training has completed, a testing module 608 can utilize corresponding testing data 610 to test the trained model. Since the testing data already include classification data, such as data operable to label, identify, or otherwise indicate ground truth, the classifications generated by the model can be compared against that data to determine the accuracy of the model, both overall and for different categories of signal data. The testing data can also be used to further train the model. The results can be analyzed and if the results are acceptable, such as where the accuracy at least meets a minimum accuracy threshold for some or all of the classifications, the model can be provided to a classifier 612 that is able to accept measured signal data 614 taken at one or more probe points, and generate classifications 616 for measured signal data. As described herein, such an approach can be used for a number of different purposes, such as part of a power source (e.g., battery) testing process.

Figure 7:
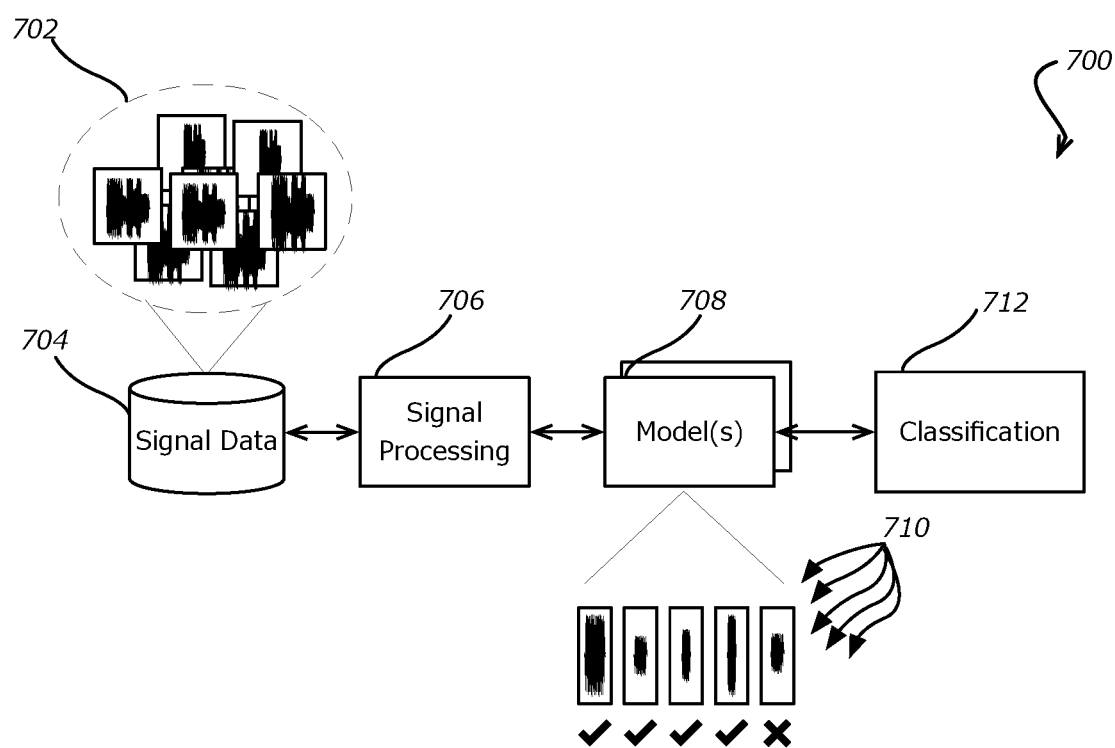
FIG. 7 illustrates an example approach to utilizing a trained model to classify a frequency response that can be utilized in accordance with various embodiments.

Once the model is trained, the model can be used to for characterizing battery packs and/or areas of battery packs, as illustrated in example 700 of FIG. 7. In this example, signal data 702 can be obtained and stored in data store 704. Signal data 702 can be obtained by, e.g., a probe system. For example, a signal generator can generate a signal that passes through a battery system. Measurement components of the probe system can measure the signal transmitted to the battery system. For example, a plurality of probes can measure reflected signals at a plurality of probe points. In certain embodiments, obtaining the signal data can include downloading the signal data, receiving a stream of the signal data, among other such approaches.

The reflected signals (e.g., signal data) can be analyzed by signal processing component 706 to generate a signature representative of signal data at each of the probe points. The signal signatures 710 can be associated with one or more signal parameters for signal data measured at respective probe points. The signal parameters can include, for example, s-parameters such as amplitude and phase of a signal, among other such parameters.

Signal processing component 706 can utilize one or more models 708 and frequency domain reflectometry and other appropriate techniques to analyze signal signatures to generate an output indicative of a condition of a power source (e.g., a battery cell) and/or a power source connection component (e.g., a battery cell connection component). In various embodiments, the output includes classification information that classifies or otherwise characterizes a signature. The classification can indicate whether there is a defect in a trace, connection component, etc. and locations of those defects. Example classifications include "no defect," "defect," or some other classification. As shown in FIG. 7, signatures classified as no defect can be associated with a check mark or other indictor and signatures classified with a defect can be associated with a x mark or other In accordance with an embodiment, a signature can be subtracted from a baseline signal response. The difference between the measured signature and the baseline signature can be compared to a threshold to determine whether a defect is present. In the situation the measured signature satisfies the threshold, the measured signature can be classified as "no defect". In the situation the measured signature fails to satisfy the threshold, the measured signature can be classified as "defect". Signal processing component 706 can further utilize a frequency domain reflectography (FDR) technique to locate faults in the connecting components. Locating faults can include determining a location in a power system for each fault, including, for example, each measured signal. Classification of the signatures and the location of any defects can be provided as classification 712.

Figure 8:
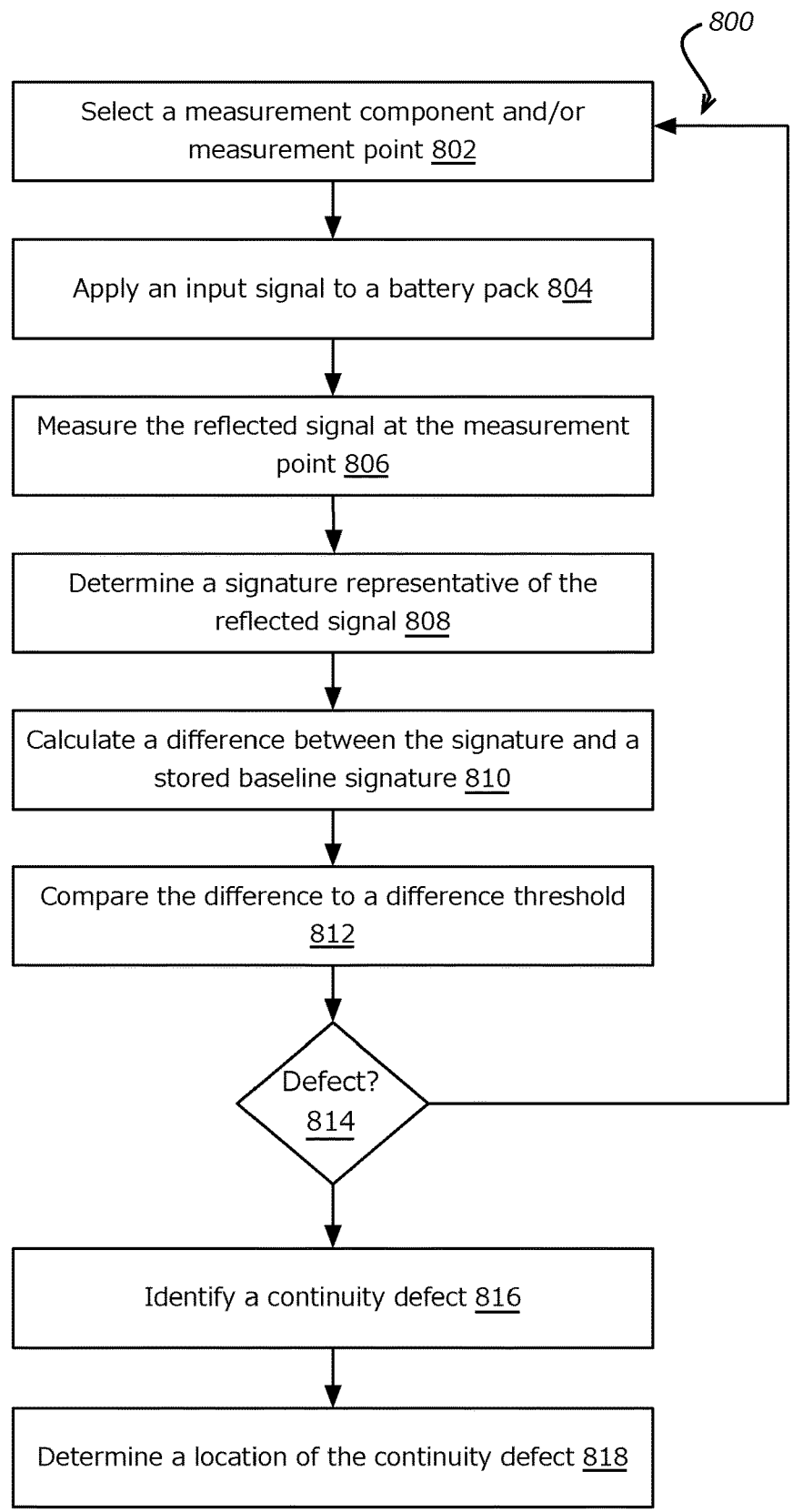
FIG. 8 illustrates an example process for detecting battery defects in a battery pack in accordance with various embodiments.

FIG. 8 illustrates an example process 800 for detecting battery defects in a battery pack in accordance with various embodiments. In an embodiment, a measurement component and/or measurement point is selected 802 from a plurality of measurement components. An example measurement component includes a probe. The probe can comprise a RF probe, single and differential probes, or any other probe know in the art for receiving RF signals. The probe can measure signal data within the battery pack. This can include, for example, reflected signals transmitted by a signal generator. The signal data can include signal parameters. Parameters can include s-parameters such as amplitude and phase of a signal, among other such parameters. The probe can be electrically coupled to one or more probe points of the battery pack. For example, the probe can be electrically coupled to busbars, welds, laser weld points, fuses, wire bonds, etc. An example measurement point includes a probe point. In an example, the location can include the probe point where the signal was obtained, the location of the defective battery component, and/or some other location operable to indicate a defect location.

An input signal is applied 804 to the battery pack or another appropriate device under test. The input signal can be generated using a signal generator such as a frequency synthesizer. The input signal can include an arbitrary waveform. The arbitrary waveform is passed down the path of the busbar to a battery cell of a battery module of the battery pack. In this example, the battery pack can include a plurality of battery modules, individual battery modules including at least one battery cell. In an embodiment, the battery modules and/or battery cells are electrically coupled to a conducting bridge via a connection component. An example conducting bridge includes a busbar. An example connection component includes a wire bond.

A reflected signal is measured 806 by the measurement component at the measurement point. The reflected signal can include a reflection of the input signal. In an embodiment, the reflected signal is a function of VSWR. The reflected signal can be associated with associated with one or more parameters. A parameter can include, for example, amplitude of the reflected signal, phase of the reflected signal, etc.

A signature representative of the measured signal can be determined 808. The signature can be based on the reflected signal parameters. It should be noted that any one of a number of techniques known in the art can be utilized to generate signatures of the measured signals. The signatures can be time or frequency signatures.

A difference signal between the signature and a stored baseline signature for the measurement point is calculated 810. The difference signal can include a value or vector of values. In various embodiments, the difference signal can include a weighted combination of values, average combination of values, etc. The stored signature can be a baseline signature. The baseline signature can be determined during a training process. The baseline signature can include be associated with battery packs at a plurality of probe points. The baseline signature can be associated with metadata identifying a battery pack, manufacturer, location within a battery pack, etc.

The difference signal is compared 812 to a threshold and a determination is made 814 whether a defect is present. In an embodiment, the threshold can correspond to an acceptable level of deviation from an expected signature. The threshold can be manually determined, determined from a trained machine learning model, and/or a combination thereof. The threshold can be dynamically updated. For example, the threshold can be updated periodically and/or in response to an event. In another example, the threshold can be updated based on the manufacturer of the battery pack.

In the situation the difference signal satisfies the threshold, the measured signature can be classified as "no defect" and the next probe point can be processed. In the situation the difference signal fails to satisfy the threshold, a continuity defect is identified 816 and the measured signature can be classified as "defect". Thereafter, a frequency domain reflectography technique or other such approach can be used to determine 818 a location of the defect.

Figure 9:
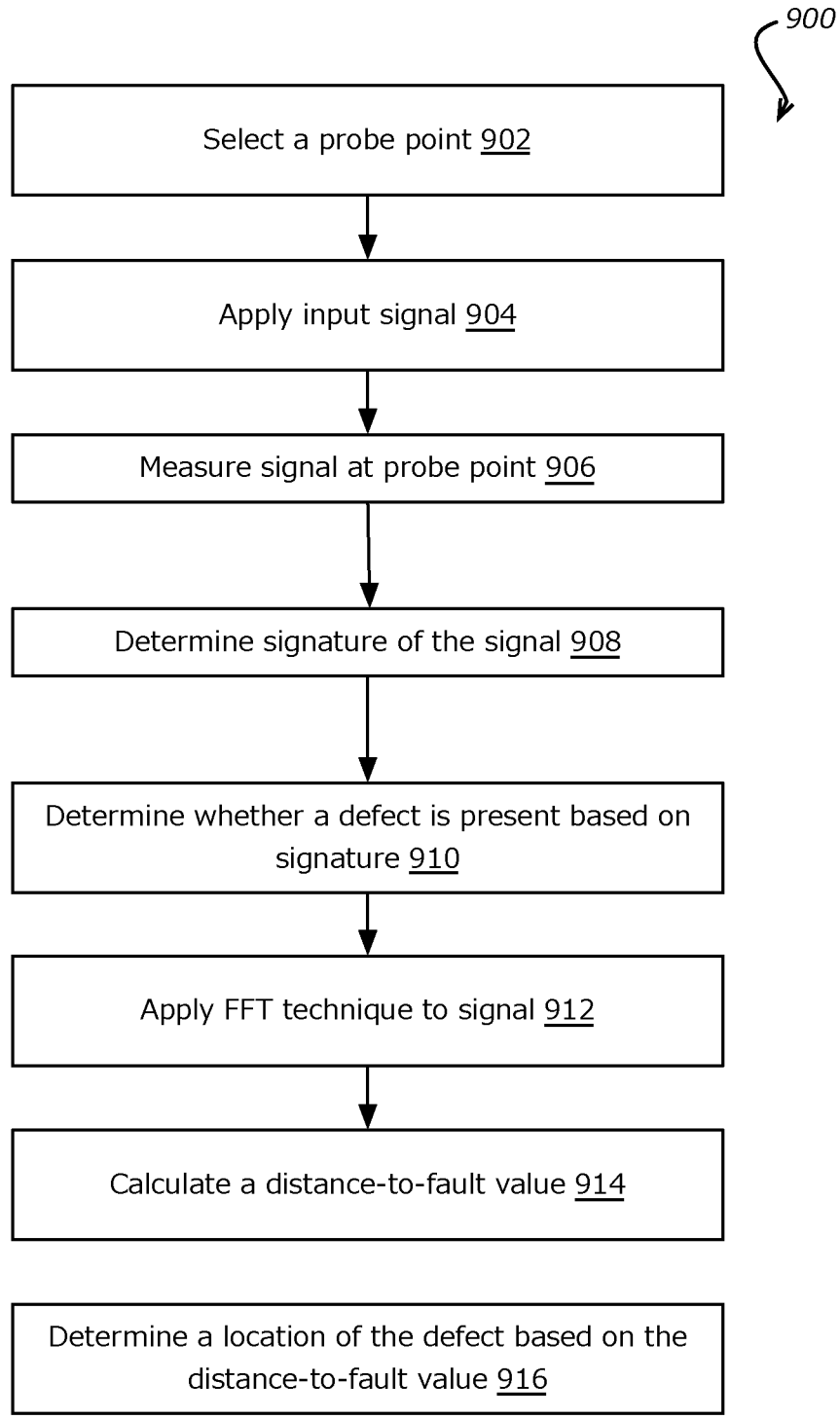
FIG. 9 illustrates an example process for determining a location of a battery defect in a battery pack in accordance with various embodiments

FIG. 9 illustrates an example process 900 for determining a location of a battery defect in accordance with various embodiments. As described, a probe point is selected 902 from a plurality of probe points. An input signal is applied 904 to a battery pack or other appropriate device under test. The input signal can be generated using a signal generator such as a frequency synthesizer. The input signal can include an arbitrary waveform, including, for example, a swept-frequency signal. An interference pattern is generated when the swept-frequency signal adds and subtracts with reflected signals from faults and other reflective characteristics within the battery pack. The vector addition of the signals in various embodiments creates a ripple pattern versus frequency, and a signal is measured 906 by a probe at the probe point. A signature of the measured signal is determined 908 and is used to determine 910 whether a defect is present in accordance with embodiments described herein. In the situation a defect is present, a fast Fourier transform (FFT) technique is applied 912 to calculate 914 the distance-to-fault value. For example, the number of ripples in the return loss (or power) versus the frequency display is determined. The number of ripples is proportional to an electrical distance to the reflective point on the transmission line. Using an appropriate conversion technique, a distance-to-fault value can be determined based on the electrical distance. The distance-to-fault value can be used to determine 916 a location in a battery pack for the defect. In an example, the location may include a battery cell coupled to a transmission line connected to the probe point where the default is detected. The battery cell may be within a potential defect area determined based on the distance-to-fault value.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit (ASIC), or on a network interface card.

Software/hardware hybrid implementations of at least some of the embodiments disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific embodiments, at least some of the features or functionalities of the various embodiments disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some embodiments, at least some of the features or functionalities of the various embodiments disclosed herein may be implemented in one or more virtualized computing environments (e.g., network computing clouds, virtual machines hosted on one or more physical computing machines, or other appropriate virtual environments).

Figure 10:
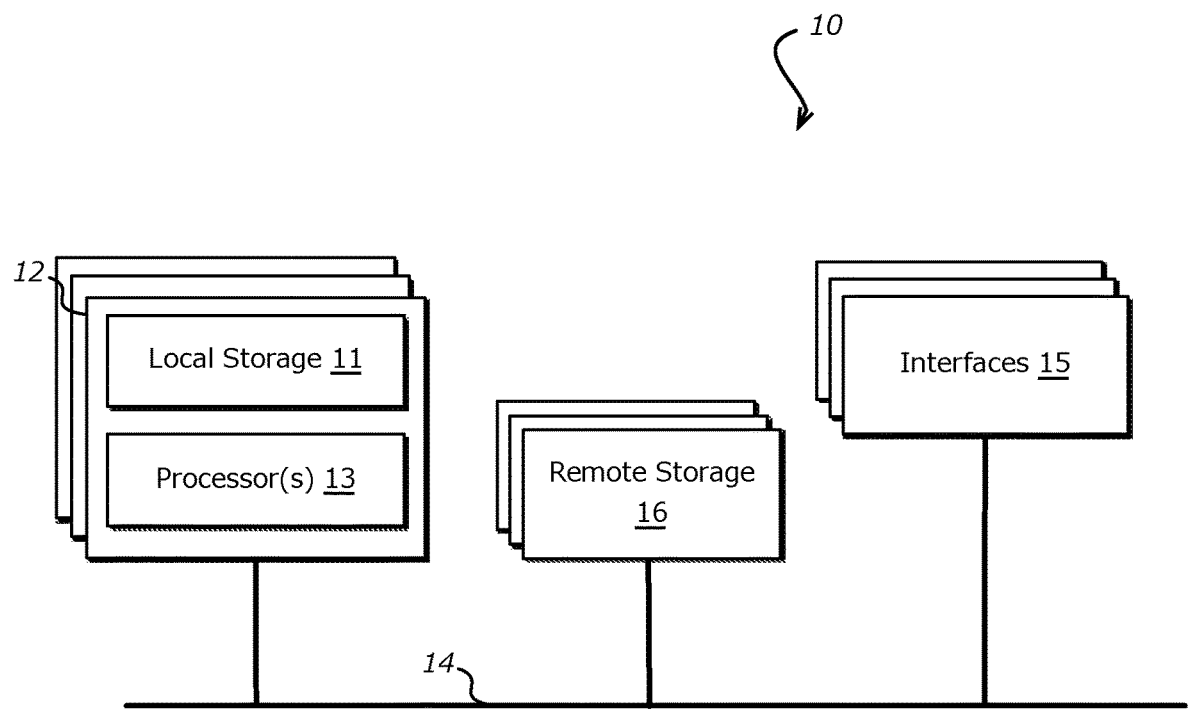
FIG. 10 illustrates components of a computing device that supports an embodiment of the present invention.

Referring now to FIG. 10, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one aspect, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one aspect, a computing device 10 may be configured or designed to function as a server system utilizing CPU 12, local memory 11 and/or remote memory 16, and interface(s) 15. In at least one aspect, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some embodiments, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a particular aspect, a local memory 11 (such as non-volatile random-access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a QUALCOMM SNAPDRAGON™ or SAMSUNG EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one aspect, interfaces 15 are provided as network interface cards (NICs). Generally. NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™, THUNDERBOLT™, PCI, parallel, radio frequency (RF), BLUETOOTH™, near-field communications (e.g., using near-field magnetics), 802.11 (WiFi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity A/V hardware interfaces) and, in some instances, volatile and/or non-volatile memory (e.g., RAM).

Although the system shown in FIG. 10 illustrates one specific architecture for a computing device 10 for implementing one or more of the embodiments described herein, it is by no means the only device architecture on which at least a portion of the features and techniques described herein may be implemented. For example, architectures having one or any number of processors 13 may be used, and such processors 13 may be present in a single device or distributed among any number of devices. In one aspect, single processor 13 handles communications as well as routing computations, while in other embodiments a separate dedicated communications processor may be provided. In various embodiments, different types of features or functionalities may be implemented in a system according to the aspect that includes a client device (such as a tablet device or smartphone running client software) and server systems (such as a server system described in more detail below).

Regardless of network device configuration, the system of an aspect may employ one or more memories or memory modules (such as, for example, remote memory block 16 and local memory 11) configured to store data, program instructions for the general-purpose network operations, or other information relating to the functionality of the embodiments described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device embodiments may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly common in the art with regard to personal computers), memristor memory, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as "thumb drives" or other removable media designed for rapidly exchanging physical storage devices), "hot-swappable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a JAVA virtual machine or equivalent, or files containing higher level code that may be executed by the computer using an interpreter (for example, scripts written in Python, Perl, Ruby, Groovy, or any other scripting language).

Figure 11:
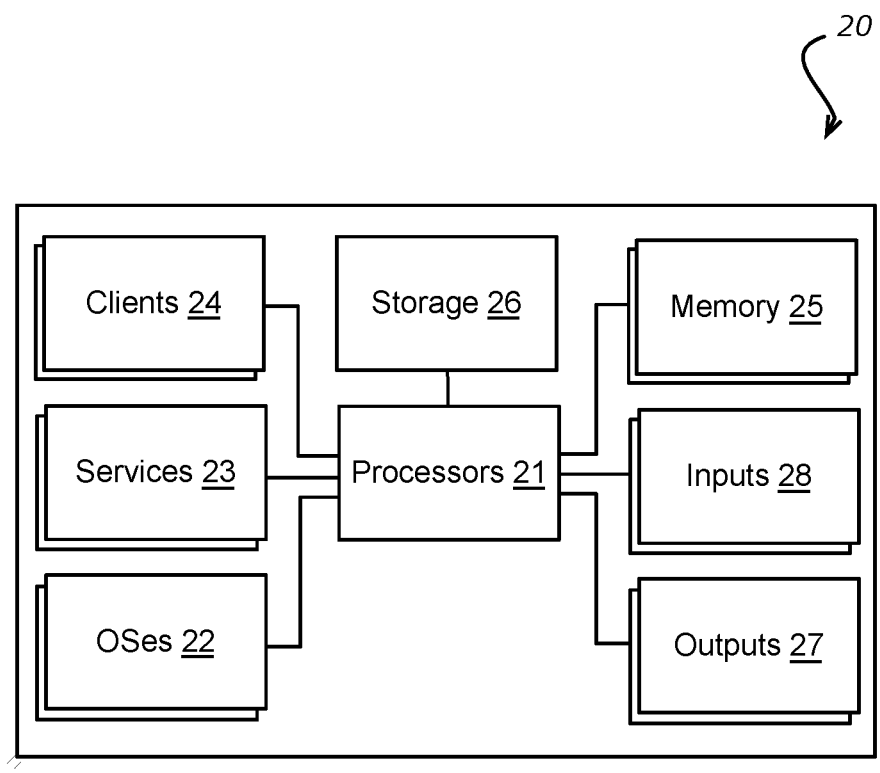
FIG. 11 illustrates an exemplary architecture of a system that supports an embodiment of the present invention.

In some embodiments, systems may be implemented on a standalone computing system. Referring now to FIG. 11, there is shown a block diagram depicting a typical exemplary architecture of one or more embodiments or components thereof on a standalone computing system. Computing device 20 includes processors 21 that may run software that carry out one or more functions or applications of embodiments, such as for example a client application 24. Processors 21 may carry out computing instructions under control of an operating system 22 such as, for example, a version of MICROSOFT WINDOWS™ operating system, APPLE macOS™ or iOS™ operating systems, some variety of the Linux operating system, ANDROID™ operating system, or the like. In many cases, one or more shared services 23 may be operable in system 20, and may be useful for providing common services to client applications 24. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touchpad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described, referring to FIG. 11). Examples of storage devices 26 include flash memory, magnetic hard drive, CD-ROM, and/or the like.

Figure 12:
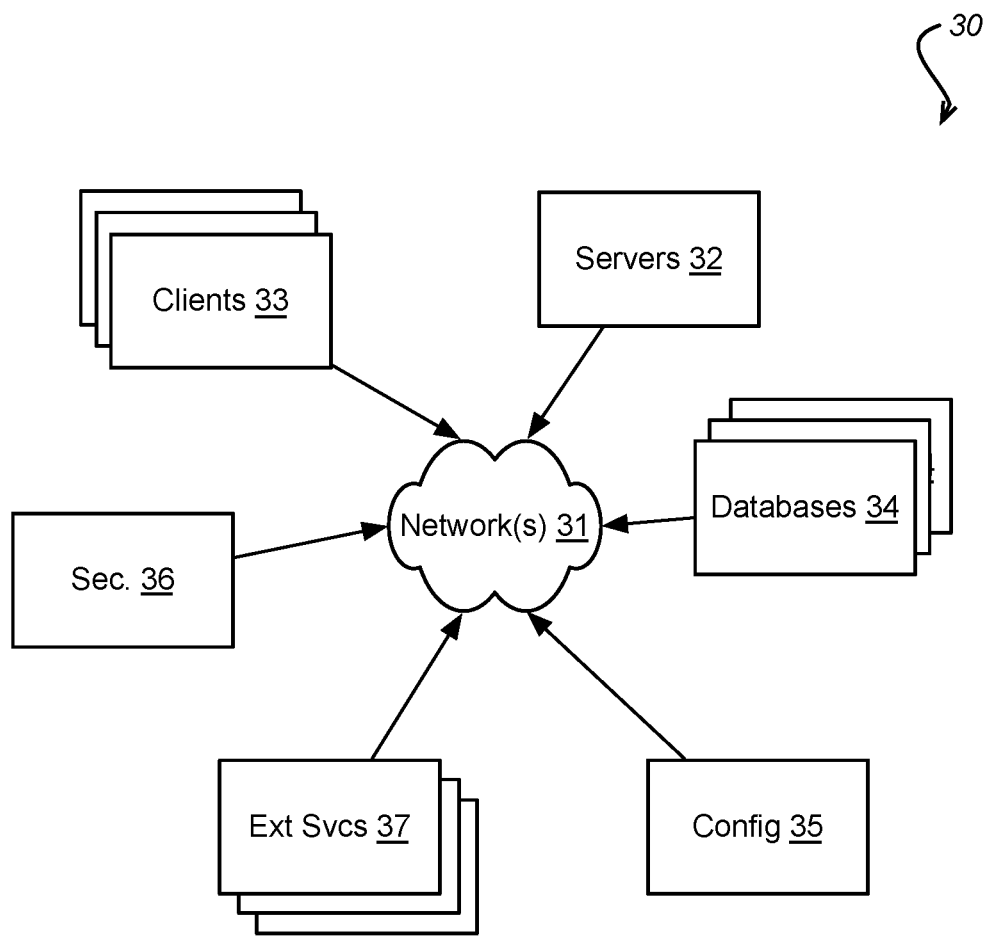
FIG. 12 illustrates another exemplary architecture of a system that supports an embodiment of the present invention.

In some embodiments, systems may be implemented on a distributed computing network, such as one having any number of clients and/or servers. Referring now to FIG. 12, there is shown a block diagram depicting an exemplary architecture 30 for implementing at least a portion of a system according to one aspect on a distributed computing network. According to the aspect, any number of clients 33 may be provided. Each client 33 may run software for implementing client-side portions of a system; clients may comprise a system 20 such as that illustrated in FIG. 11. In addition, any number of servers 32 may be provided for handling requests received from one or more clients 33. Clients 33 and servers 32 may communicate with one another via one or more electronic networks 31, which may be in various embodiments any of the Internet, a wide area network, a mobile telephony network (such as CDMA or GSM cellular networks), a wireless network (such as WiFi, WiMAX, LTE, and so forth), or a local area network (or indeed any network topology known in the art; the aspect does not prefer any one network topology over any other). Networks 31 may be implemented using any known network protocols, including for example wired and/or wireless protocols.

In addition, in some embodiments, servers 32 may call external services 37 when needed to obtain additional information, or to refer to additional data concerning a particular call. Communications with external services 37 may take place, for example, via one or more networks 31. In various embodiments, external services 37 may comprise web-enabled services or functionality related to or installed on the hardware device itself. For example, in one aspect where client applications 24 are implemented on a smartphone or other electronic device, client applications 24 may obtain information stored in a server system 32 in the cloud or on an external service 37 deployed on one or more of a particular enterprise's or user's premises.

In some embodiments, clients 33 or servers 32 (or both) may make use of one or more specialized services or appliances that may be deployed locally or remotely across one or more networks 31. For example, one or more databases 34 may be used or referred to by one or more embodiments. It should be understood by one having ordinary skill in the art that databases 34 may be arranged in a wide variety of architectures and using a wide variety of data access and manipulation means. For example, in various embodiments one or more databases 34 may comprise a relational database system using a structured query language (SQL), while others may comprise an alternative data storage technology such as those referred to in the art as "NoSQL" (for example, HADOOP CASSANDRA™, GOOGLE BIGTABLE™, and so forth). In some embodiments, variant database architectures such as column-oriented databases, in-memory databases, clustered databases, distributed databases, or even flat file data repositories may be used according to the aspect. It will be appreciated by one having ordinary skill in the art that any combination of known or future database technologies may be used as appropriate, unless a specific database technology or a specific arrangement of components is specified for a particular aspect described herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, some embodiments may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with embodiments without limitation, unless a specific security 36 or configuration system 35 or approach is specifically required by the description of any specific aspect.

Figure 13:
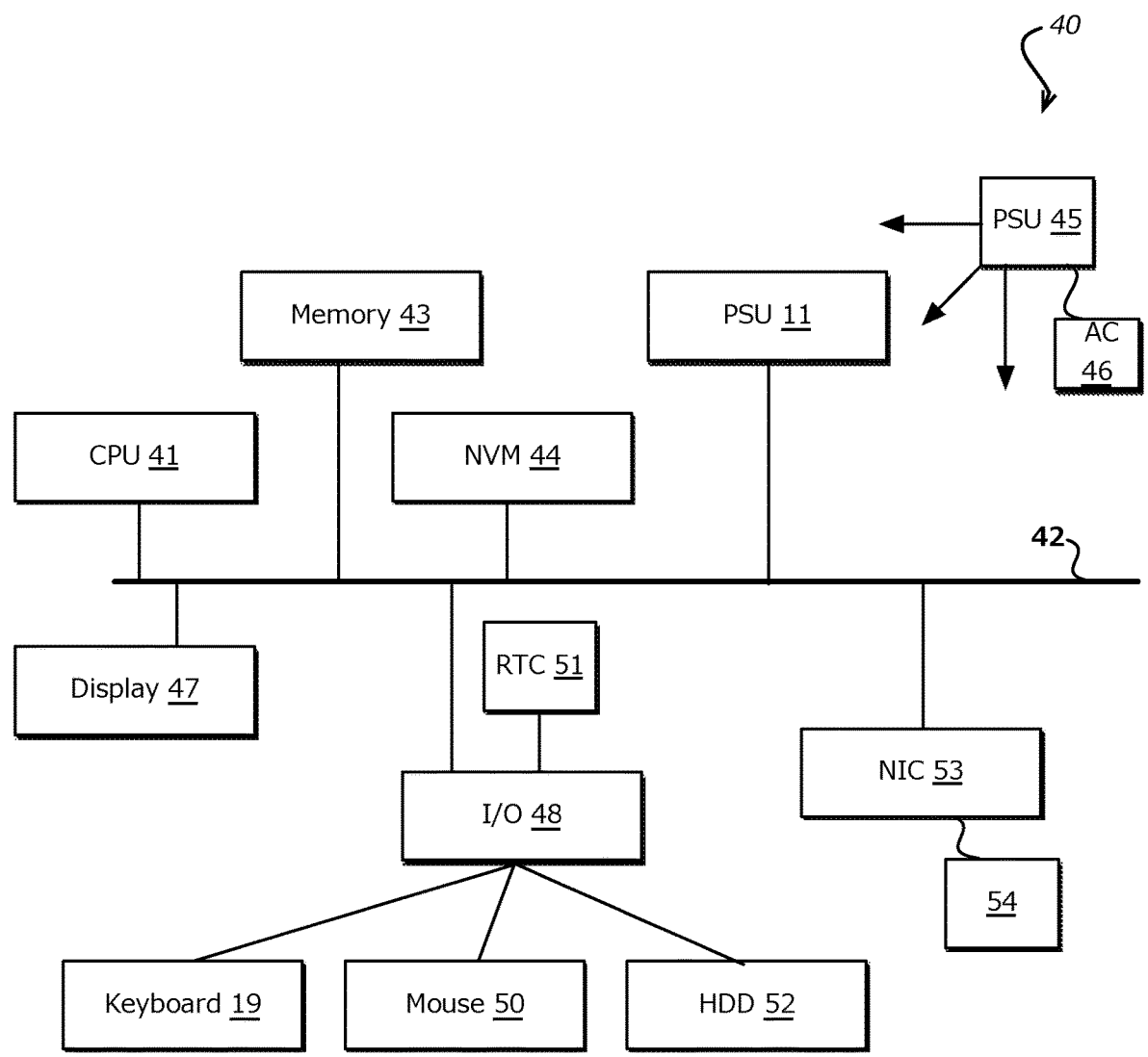
FIG. 13 illustrates components of a computer system that supports an embodiment of the present invention.

FIG. 13 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to keyboard 49, pointing device 50, hard disk 52, and real-time clock 51. NIC 53 connects to network 54, which may be the Internet or a local network, which local network may or may not have connections to the Internet. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various embodiments, functionality for implementing systems or methods of various embodiments may be distributed among any number of client and/or server components. For example, various software modules may be implemented for performing various functions in connection with the system of any particular aspect, and such modules may be variously implemented to run on server and/or client components.

The skilled person will be aware of a range of possible modifications of the various embodiments described above. Accordingly, the present invention is defined by the claims and their equivalents.

Additional Considerations

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive "or" and not to an exclusive "or." For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for creating an interactive message through the disclosed principles herein. Thus, while particular embodiments and applications have been illustrated and described, it is to be understood that the disclosed embodiments are not limited to the precise construction and components disclosed herein. Various apparent modifications, changes and variations may be made in the arrangement, operation and details of the method and apparatus disclosed herein without departing from the spirit and scope defined in the appended claims.

What is claimed is:

1. An apparatus for testing battery cells connected in a battery pack, the apparatus comprising:
    a signal generator configured to apply a signal to the battery pack, wherein the battery pack comprises a plurality of battery modules, individual battery modules including at least one battery cell, the plurality of battery modules and battery cells being electrically coupled to a conducting bridge, wherein the conducting bridge includes a bus bar operable to support signal propagation to specific measurement points;
a DC block coupled to the signal generator and configured to pass the signal while isolating high-DC voltages from the battery pack;
a probe selection component electrically coupled to a plurality of measurement components, individual measurement components operable to electrically couple to measurement points on the battery pack; and
a digital signal processing component configured to:
  determine a signature of a reflected signal obtained at one of the plurality of measurement points, the reflected signal being associated with signal parameters,
  calculate a difference between the signature and a stored signature for the measurement point to generate a difference value;
  compare the difference value to a threshold;
  classify the reflected signal, wherein classification includes applying a trained model to identify deviations from a baseline signature, the trained model being operable to analyze expected signal data obtained from measurement points of a baseline battery pack; and
  determine a continuity defect and a location of the continuity defect, wherein the location is determined by applying frequency-domain reflectometry and a fast Fourier transform technique to determine an electrical distance and distance-to-fault value.

2. The apparatus of claim 1, wherein the bus bar includes one of a wire bond or a tab.

3. The apparatus of claim 1, wherein the DC block includes one of an opto-isolators or an inductor.

4. The apparatus of claim 1, wherein the probe selection component includes one of a MUX or a robotic arm.

5. The apparatus of claim 1, further comprising:
a trained model operable to determine the baseline signature.

6. The apparatus of claim 5, wherein the trained model is operable to classify a signal deviation measured at corresponding probe points of different battery packs.

7. The apparatus of claim 1, further comprising:
a trained model operable to recognize a baseline battery pack.

8. A method for testing battery cells connected in a battery pack, the method comprising:
selecting a measurement component from a plurality of measurement components, the measurement component being coupled to one of a plurality of measurement points associated with the battery pack, wherein each measurement point corresponds to a distinct electrical connection within the battery pack;
applying an input signal to the battery pack, wherein the battery pack comprises a plurality of battery modules, individual battery modules including at least one battery cell, the plurality of battery modules and the battery cells being electrically coupled to a conducting bridge, wherein the conducting bridge includes a bus bar operable to support signal propagation to specific measurement points;
measuring a reflected signal by the measurement component at a measurement point, the reflected signal being associated with signal parameters;
determining a signature based on the signal parameters, the signature being representative of the reflected signal;
calculating a difference between the signature and a stored signature for the measurement point to generate a difference value;
comparing the difference value to a threshold;
classifying the reflected signal, wherein classification includes applying a trained model to identify deviations from a baseline signature, the trained model being operable to analyze expected signal data obtained from measurement points of a baseline battery pack; and
determining a continuity defect and a location of the continuity defect, wherein the location is determined by applying frequency-domain reflectometry and a fast Fourier transform technique to determine an electrical distance and distance-to-fault value.

9. The method of claim 8, further comprising:
recognize the continuity defect; and
propagating a reflected signal associated with the continuity defect for further processing
to determine a location of the continuity defect within the battery pack.

10. The method of claim 9, wherein determining the electrical distance and the distance-to-fault value incudes:
analyzing variations in impedance detected in the reflected signal using frequency-domain reflectometry;
applying a fast Fourier transform technique on the reflected signal to determine an electrical distance to the continuity defect; and
correlating the electrical distance to a spatial arrangement of battery cells within the battery pack to determine a distance-to-fault value.

11. The method of claim 8, further comprising:
obtaining training data, the training data including expected signal data obtained at one or more probe points of a baseline battery pack; and
training a model to generate a baseline model to recognize the expected signal data in reflected signal data.

12. The method of claim 11, further comprising:
applying the baseline model to the reflected signal; and
determining whether the continuity defect is present.

13. The method of claim 8, further comprising:
obtaining training data, the training data representing a signal deviation from a first probe point associated with a first battery cell and a corresponding second probe point associated with a second battery cell, the first battery cell associated with a first battery pack and the second battery cell associated with a second battery pack; and
training a model to generate a deviation model to recognize an acceptable signal deviation for corresponding probe points of different battery packs.

14. The method of claim 13, further comprising:
applying the deviation model to signal deviation measured between different battery packs at corresponding probe points, the different battery packs including a baseline battery pack and a test battery pack; and
determining a classification of the test battery pack.

15. The method of claim 14, wherein the classification indicates a baseline battery pack.

16. A non-transitory computer readable storage medium storing instructions that, when executed by at least one processor of a computing system, causes the computing system to:
select a measurement component from a plurality of measurement components, the measurement component being coupled to one of a plurality of measurement points associated with a battery pack, wherein each measurement point corresponds to a distinct electrical connection within the battery pack;

apply an input signal to the battery pack, wherein the battery pack comprises a plurality of battery modules, individual battery modules including at least one battery cell, the battery modules and the at least one battery cell being electrically coupled to a conducting bridge, wherein the conducting bridge includes a bus bar operable to support signal propagation to specific measurement points;

measure a reflected signal by the measurement component at a measurement point, the reflected signal being associated with signal parameters;

determine a signature based on the signal parameters, the signature being representative of the reflected signal;

calculate a difference between the signature and a stored signature for the measurement point to generate a difference value;

compare the difference value to a threshold;

classify the reflected signal, wherein classification includes applying a trained model to identify deviations from a baseline signature, the trained model being operable to analyze expected signal data obtained from measurement points of a baseline battery pack; and determine a continuity defect and a location of the continuity defect, wherein the location is determined by applying frequency-domain reflectometry and a fast Fourier transform technique to determine an electrical distance and distance-to-fault value.

17. The non-transitory computer readable storage medium of claim 16, wherein the instructions, when executed by the at least one processor, further enables the computing system to:
  recognize the continuity defect; and
  propagate a reflected signal associated with the continuity defect for further processing to determine a location of the continuity defect within the battery pack.

18. The non-transitory computer readable storage medium of claim 17, wherein the instructions, when executed by the at least one processor to determine the electrical distance and the distance-to-fault value incudes, further enables the computing system to:
  analyze variations in impedance detected in the reflected signal using frequency-domain reflectometry;
  apply a fast Fourier transform technique on the reflected signal to determine an electrical distance to the continuity defect; and
  correlate the electrical distance to a spatial arrangement of battery cells within the battery pack to determine a distance-to-fault value.

19. The non-transitory computer readable storage medium of claim 16, wherein the instructions, when executed by the at least one processor, further enables the computing system to:
  training a first model to generate a baseline model to recognize expected signal data in reflected signal data; and
  training a second model to generate a deviation model to recognize an acceptable signal deviation for corresponding probe points of different battery packs.

* * * * *